US007617466B2

(12) United States Patent
Yoshikawa

(10) Patent No.: US 7,617,466 B2
(45) Date of Patent: Nov. 10, 2009

(54) CIRCUIT CONJUNCTIVE NORMAL FORM GENERATING METHOD, CIRCUIT CONJUNCTIVE NORMAL FORM GENERATING DEVICE, HAZARD CHECK METHOD AND HAZARD CHECK DEVICE

(75) Inventor: Ko Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 411 days.

(21) Appl. No.: 11/586,516

(22) Filed: Oct. 26, 2006

(65) Prior Publication Data

US 2007/0266348 A1 Nov. 15, 2007

(30) Foreign Application Priority Data

May 9, 2006 (JP) .............................. 2006-130238

(51) Int. Cl.
G06F 17/50 (2006.01)
(52) U.S. Cl. .................................... 716/5; 716/4; 716/6
(58) Field of Classification Search .................. 716/4–5; 714/30, 724–745
See application file for complete search history.

(56) References Cited

U.S. PATENT DOCUMENTS

2005/0102594 A1 * 5/2005 Dey et al. .................... 714/733

FOREIGN PATENT DOCUMENTS

| JP | 02-112773 | 4/1990 |
|----|-----------|--------|
| JP | 05-035816 | 2/1993 |
| JP | 05-128200 | 5/1993 |

OTHER PUBLICATIONS

H. Tanaka, "Introduction to Logic Calculation," Chapter 5 Calculation quantity problems involving propositional logic, 5.1 Satisfiability problem, ISBN4-7853-15-5-9, Oct. 1997, pp. 118-124.
A. Maruoka, "Clarifying Computer Principles: Automaton Linguistic Theory and Computational Theory," 9.6 review of formula satisfiability problems for circuit satisfiability problems, ISBN4-7819-1104-8, Nov. 2005, pp. 234-241.
J. P. Marques-Silva, "GRASP: A Search Algorithm for Propositional Satisfiability," IEEE Transactions on Computers, vol. 48:5, May 1999, pp. 506-521.
C. Jeong et al., "Fast Hazard Detection in Combinational Circuits," In Proc. Of Design Automation Conference 2004, pp. 592-595.

* cited by examiner

Primary Examiner—Vuthe Siek
(74) Attorney, Agent, or Firm—Foley & Lardner LLP

(57) ABSTRACT

A hazard check method and device for making hazard checks of logic circuits containing asynchronous paths and multi-cycle paths. The hazard check device includes a means for equivalent conversion to only pre-embedded conjunctive normal form blocks if not all of the blocks in the logic circuit were embedded conjunctive normal form blocks; a means for tracing each termination point recorded in the signal information from the logic circuit, inputting the signal information to the circuit up to the flip-flop, and assigning numerals to each net; and a means for tracing each termination point recorded in the signal information from the logic circuit, referring to the logic library for each block, and searching for the same logic conjunctive normal form (CNF) as in the logic library, and substituting the conjunctive normal form into the numerals assigned to the connected network, and outputting it as the circuit conjunctive normal form; and a means for adding a circuit conjunctive normal form whose logic is equivalent to that numeral, to each net for each termination point recorded in the signal information.

12 Claims, 9 Drawing Sheets

SET_FALSE_PATH-FROM MULTI_ASYNC-TO A_REG

SET_CASE_ANALYSIS 0 STRB

EXPRESSING CIRCUIT OPERATION WITH 3 VALUES

| 3-VALUES | | INTERNAL EXPRESSION |
|---|---|---|
| 0 | ⟶ | (0 0) |
| 1 | ⟶ | (0 1) |
| X | ⟶ | (1 1) |

DC:DON'T CARE

A → B       IF A, THEN B
   THEN ...
A' + B = 1   BOOLEAN METHOD

020
CIRCUIT CONJUNCTIVE NORMAL FORM GENERATING METHOD, CIRCUIT CONJUNCTIVE NORMAL FORM GENERATING DEVICE, HAZARD CHECK METHOD AND HAZARD CHECK DEVICE

BACKGROUND OF THE INVENTION

1. Field of the Invention

The present invention relates to a hazard check method and a hazard check device for checking logic circuit hazards, as well as to a circuit conjunctive normal form (also called CNF) generating method and circuit CNF generating device for generating circuit conjunctive normal forms utilized in hazard check devices and hazard check methods.

2. Description of the Related Art

Systems for generating logic circuits from functions written in hardware terminology are capable of generating circuits just as described in the hardware terminology. However these systems do not take glitches into account during logic optimizing. Synthesizing paths with exceptional timing such as asynchronous paths and multi-cycle paths causes glitches and a hazard occurs when these glitches are conveyed at the timing for inputting data to the flip-flop data, so that the circuit (mistakenly triggers) operation is defective. Moreover, no method was available for detecting these hazards.

The following is a typical case where a hazard is generated at an exceptional timing. First of all, as shown in FIG. 2, a control signal (strobe signal) is installed for controlling whether or not to input data from an exceptional timing path. When that control signal is 0, nothing is input since that exceptional timing path was not set. Conversely, when the control signal is 1, the signal is input. The circuit in FIG. 2 is designed so that no changes in asynchronous paths and multi-cycle paths will ever be conveyed to the flip-flop when that control signal is 0.

However, systems for synthesizing logic circuits might include the circuit of FIG. 3. This circuit is logically identical to that in FIG. 2; however, this circuit conveys data changes caused by effects from the exceptional timing path to the flip-flop even when the control signal is 0. When these changes occur, the flip-flop clock signal (pulse) rises and causes faulty logic circuit operation (hazard).

Technology for checking these type of hazards was disclosed for example in Japanese Unexamined Patent Publication No. JP 2(1990)-112773A for selecting a logic gate from among the logic gates in the digital circuit for a hazard check, and then making a hazard check using judgment criteria described in the hazard generating conditions for that gate.

Also as disclosed for example in Japanese Unexamined Patent Publication No. JP 5(1993)-35816 A, the input conditions in a simulation for detecting a hazard include not only "0" and "1", but "x" which is neither "0" nor "1", or in other words is an unfixed level.

Technology was also disclosed for example in, "Fast Hazard Detection in Combinational Circuits", by C. Jeongand S. M. Nowick, in In Proc. of Design Automation Conference 2004, pp. 592-595 where in FIG. 1, the signal states for inducing a hazard are six types other than 0 and 1.

SUMMARY OF THE INVENTION

The present invention has the object of providing a hazard check method and a hazard check device for checking for hazards in logic circuits containing a synchronous paths and multi-cycle paths, and also a circuit conjunctive normal form (CNF) generating method and circuit conjunctive normal form generating device for generating circuit conjunctive normal forms utilized in hazard check devices and hazard check methods.

A first aspect of the present invention provides a circuit conjunctive normal form generating method, including: reading a logic circuit and an information of an end point; outputting logic operation of a section from a start point traced from said end point to said end point in a conjunctive normal form; and setting a logic equivalent to a hazard to said end point and a net where exceptional timing signal exists.

A second aspect of the present invention provides a hazard check method, including: reading a logic circuit and an information of an end point; outputting logic operation of a section from a start point traced from said end point to said endpoint in a conjunctive normal form; setting a logic equivalent to the hazard to said end point and said net where exceptional timing signal exists; and making a hazard check by deciding a satisfiability of said circuit conjunctive normal form.

The first effect is an all-inclusive check for the occurrence of hazards.

The reason for this is that the possibility of a hazard occurring is converted into a satisfiability problem, and an all-inclusive check is made on that problem.

BRIEF DESCRIPTION OF THE DRAWINGS

FIG. 10 shows logic conversion to be utilized in the embodiment of this invention;

FIG. 11 is a table expressing the NOR gate as a circuit conjunctive normal form (CNF) in the embodiment of this invention;

FIG. 12 shows a sequence of numbers converted from the formula shown in FIG. 11, so as to input to the satisfiability decision unit; and FIG. 13 shows a sequence of numbers showing the circuit conjunctive normal form (CNF) for checking the hazard in the circuit shown in FIG. 4.

DETAILED DESCRIPTION OF THE PREFERRED EMBODIMENT

Figure 1:
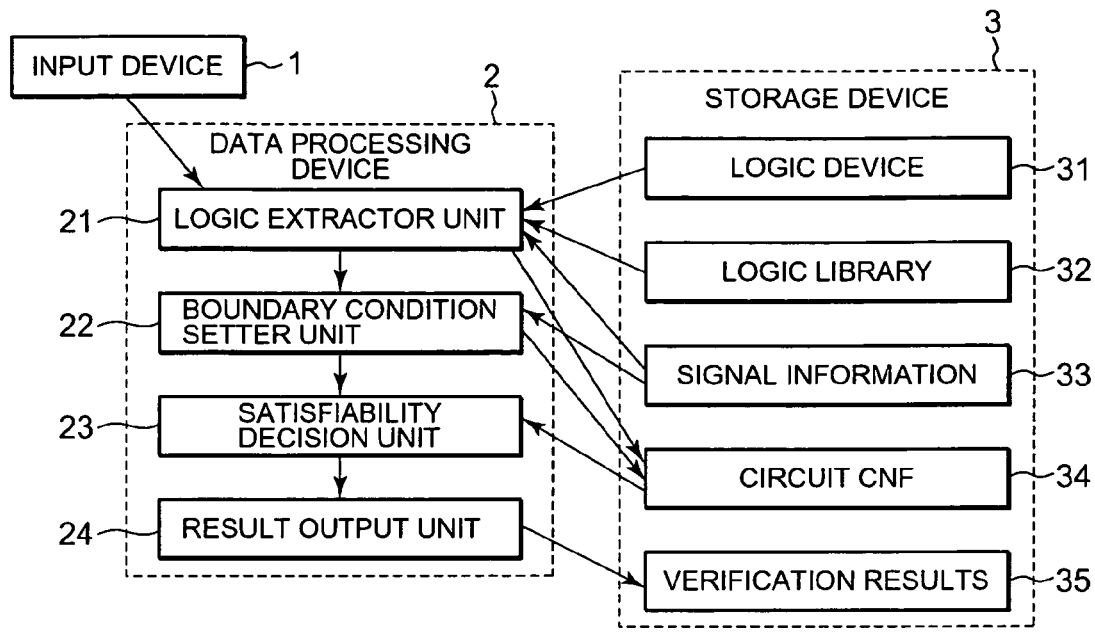
FIG. 1 is a block diagram showing the structure of the hazard check device of the first embodiment of this invention.
Figure 2:
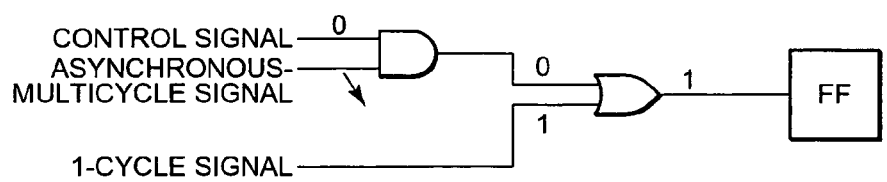
FIG. 2 is a diagram showing a typical circuit prior to logic synthesis.
Figure 3:
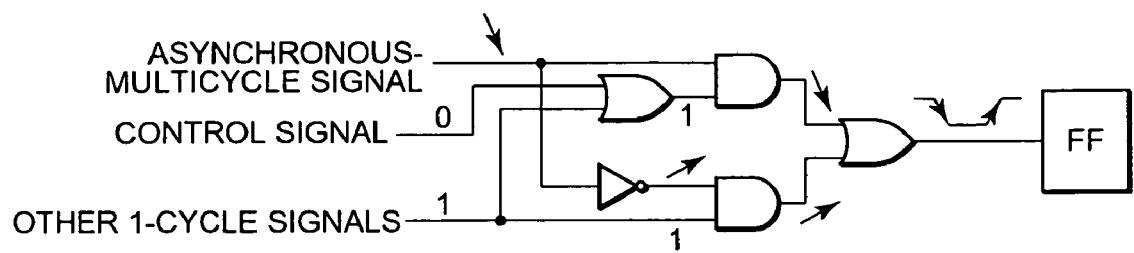
FIG. 3 is a circuit diagram showing a typical circuit generated when a logic synthesizing device was applied to the circuit shown in FIG. 2.

The preferred embodiments of this invention are described next while referring to the drawings.

The present invention makes an all-inclusive check of whether a hazard has occurred in circuits synthesized by logic synthesizing systems for paths with exceptional timing such as asynchronous and multi-cycle paths.

Figure 14:
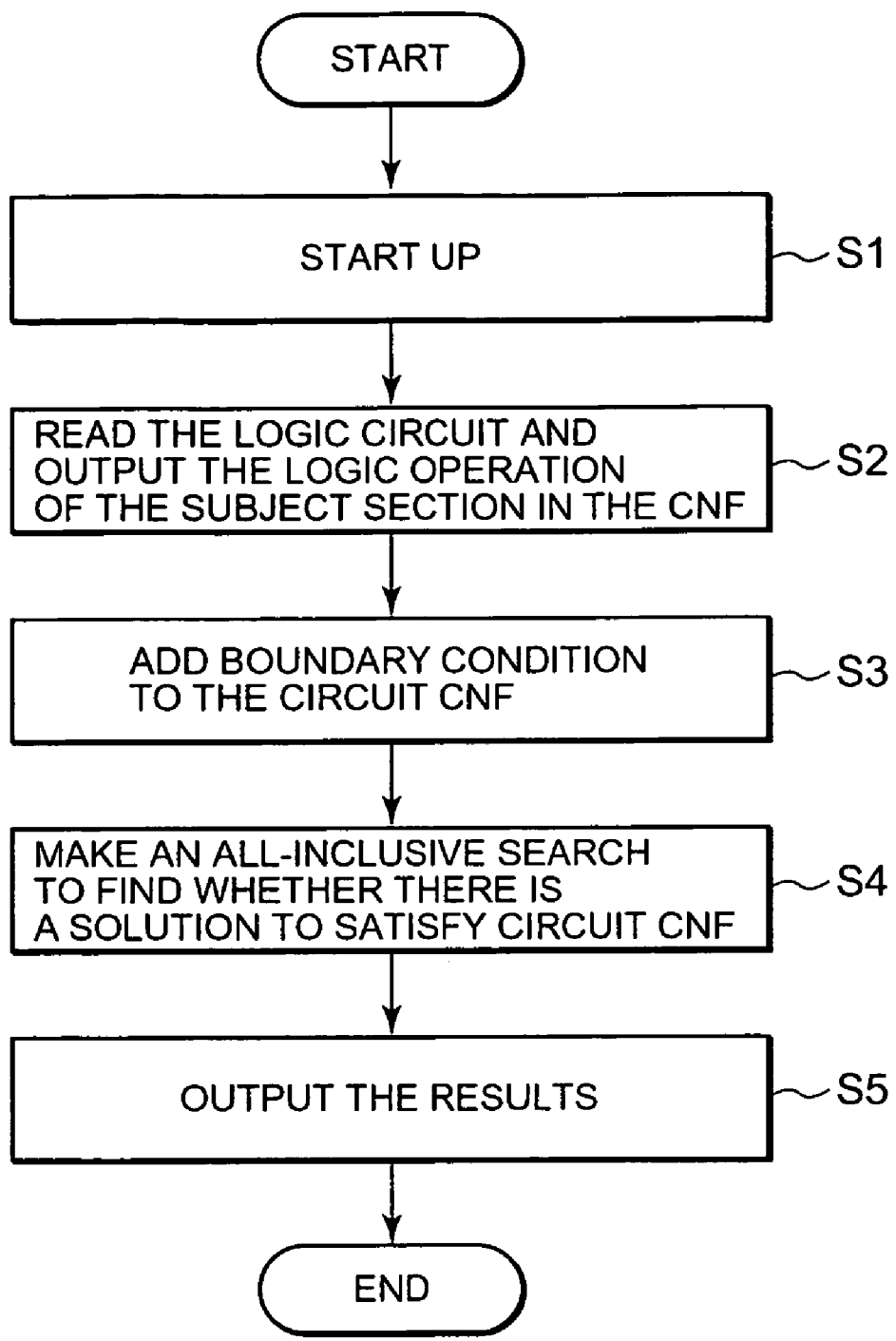
FIG. 14 is a flow chart showing example of operation of checking the hazard in the circuit shown in FIG. 1.

The description is given while referring to FIGS. 1 and 14. This method starts up from an input device 1 (step S1). A logic extractor unit 21 reads a logic circuit 31 after generation by logic synthesis as the logic synthesis results, traces from the circuit output and input pin of the flip-flop with the signal information subject to verification, to the input side, upto the flip-flop or the circuit input (it is called as start point), and refers to the logic information of each block stored in the logic library 32, and outputs the logic operation of the subject section of the circuit expressed as a 3-value (0, 1, X) circuit operation, in the circuit conjunctive normal form (hereafter called CNF) 34 (step S2).

A boundary condition setter unit 22 reads the signal information 33 and adds boundary condition to the circuit CNF 34 (step S3). That is, a boundary condition setter unit 22 specifies an X value for exceptional timing signals (asynchronous signals or multi-cycle signals); a logic value (specified value) so that signals with exceptional timing will not be conveyed to the control signal; and both logic values of 0 or 1 for other signals (usual synchronization signals) and adds these to the circuit CNF 34.

A satisfiability decision unit 23 reads the circuit CNF 34 and makes an all-inclusive search to find whether there is a solution to satisfy these values (step S4).

The satisfiability decision unit 23 is conventionally comprised of a particular section, and the section that generates the circuit CNF 34 is a section conforming to this invention.

Documents of the conventional art relating to the satisfiability problem are described next:

"Introduction to Logic Calculation" by Hisao Tanaka (author), honorary professor at Hosei University, pp. 118-124, published October 1997, ISBN4-7853-1505-9, Chapter 5 Calculation quantity problems involving propositional logic, 5.1 Satisfiability problem, "Clarifying computer principles: Automaton Linguistic Theory and Computational Theory" by Akira Maruoka (author) professor at Tohoku University, pp. 234-241, ISBN4-7819-1104-8 published November 2005, by SAIENSU-SHA Co., Ltd., 9.6 Review of formula satisfiability problems for circuit satisfiability problems, and GRASP: A Search Algorithm for Propositional Satisfiability, IEEE Transactions on Computers, Vol. 48, No. 5, 1999, pp. 506-521.

The circuit CNF is read by the satisfiability decision unit 23 in the related art; however, it also conforms to this invention.

If the satisfiability decision unit 23 discovers a satisfaction solution then the result output unit 24 reports a hazard to the verification results 35 and if there is no satisfaction solution reports that there is no hazard to the verification results 35 (step S5).

The structure of the embodiment of this invention is next described in detail while referring to the drawings.

The structure is described next while referring to FIG. 1.

This invention includes an input device 1 such as a keyboard, a data processing device 2 for programming control operations, and a storage device 3 for storing information.

The storage device 3 stores a logic circuit 31, a logic library 32, signal information 33, a circuit CNF 34, and a verification results 35 as data.

The logic circuit 31 is the logic circuit to be checked.

The logic library 32 is a library expressing the logic for each gate.

The signal information 33 is a list of start/end point signal names for exceptional timing paths, and strobe signal names for controlling the exceptional timing signals, and logic values at the time that signal does not convey the exceptional timing signal.

The circuit CNF 34 is a formula expressing the conjunctive normal form of the section to be checked (verified). The circuit CNF in the format as shown in FIG. 11 is a sum-product Boolean type format.

The verification results 35 is check results on whether a hazard will occur or not.

The data processing device 2 includes a logic extractor unit 21, a boundary condition setter unit 22, a satisfiability decision unit 23, and a result output unit 24.

The logic extraction unit 21 reads the logic circuit 31, extracts the outputs one at a time from the flip-flop and circuits forming the end point for the exceptional timing signal recorded in the signal information 33, traces them from that input side to the output pin of the flip-flop or input of the circuit, checks the logic on that input side with the logic library 32, and converts that logic to the circuit CNF 34.

The boundary setter unit 22 refers to the signal unit 33, and specifies an X value for start/end points of exceptional timing signals; specifies a designated logic value for strobe signals, specifies a designated 1-cycle signal for other input signals and adds and outputs those values to the circuit CNF 34.

The satisfiability decision unit 23 reads the circuit CNF 34 and makes an all-inclusive decision on whether there is a solution satisfying that CNF (conjunctive normal form) or in other words where an X value will be conveyed to that end point.

If there is a satisfaction solution, then that circuit might generate a hazard, and if there is no solution then there is no possibility of a hazard. The result output unit 24 reports these results (possible hazard or no hazard) to the verification results 35.

The operation of the first embodiment of this invention is described next while referring to FIG. 1.

Figures 4, 5, 6:
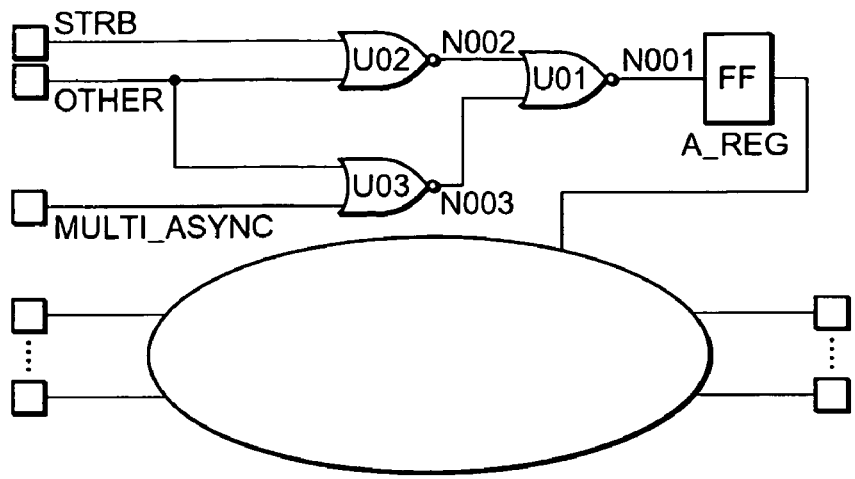
FIG. 4 is a concept circuit diagram showing an example of a circuit to be checked by the hazard check device of the embodiment of this invention.
FIG. 5 shows example of signal information in the circuit shown in FIG. 4.
FIG. 6 is a table showing a 3-value expression by the embodiment of this invention.

First of all, FIG. 4 shows an example of the logic circuit 31 for input.

FIG. 5 shows an example of the signal information 33. Here, the first line is an asynchronous path, from an input labeled multi-async (start point) (present in FIG. 4) to a register (present in FIG. 4) labeled the A_reg (end point), indicating this is a false path with no timing restrictions and is not 1 cycle operation. In the second line, the input (present in FIG. 4) labeled strb is the control signal. When this value is 0, it indicates the above described path is inactive (does not convey the signal).

Logic expressions used in this method are described next before starting a detailed description. This method utilizes three values 0, 1, X for circuit operation but a typical satisfiability problem only uses binary (two values) of 0 and 1. Internal expressions therefore utilize two variables for 0, 1, X. An example is shown in FIG. 6. Here 0 is expressed as (0, 0), 1 as (0,1), and X as (1,1). Note that there is no (1,0) (This combination of values was used here but other combinations may also be used).

Figures 7, 8, 9:
FIG. 7 is a diagram showing parameters resulting when the 3-value expression was applied to a NOR gate in the embodiment of this invention.
FIG. 8 is a table expressing the NOR gate input/output relation for the 3-value expression in the embodiment of this invention.
FIG. 9 is another table expressing the NOR gate input/output relation for the 3-value expression in the embodiment of this invention.

A simple example using these logic values expresses the NOR gate input/output relation in FIG. 7 as shown in FIG. 8. One input for example (i1, i2) while the other input is (j1, j2). When these inputs are respectively (0,0) and (0,1), then a (0,0) is output as shown here. This operation is equivalent to outputting a 0 when a 0 and a 1 are input and is called binary logic. A truth table as shown in FIG. 9 can be derived from these results (.This truth table is not unified.).

The truth table results are converted into the relation A→B (formula 1) (If A is established, the B is also established.) such as shown in the upper formula in FIG. 10. Moreover, as shown in FIG. 10, A→B can be converted into the Boolean expression A'+B=1 (formula 2). Here, the apostrophe (') indicates a logic inversion.

Each line of the truth table in FIG. 9 is converted into the A→B format in the FIG. 11 formulas, and those conversion results shown in the format of (formula 2). For example, $$i1'*i2 \rightarrow o1'*o2'$$

is a format expressing the first line of FIG. 9 as the formula 1, and $$(i1+i2'+o1')(i1+i2'+o2')$$

is a format expressing the first line of FIG. 9 as the formula 2.

The formulas in FIG. 11 are always established for the two-input NOR gate, and so can be summarized in the following formula 3.

$$(i1 + i2' + o1') \times (i1 + i2' + o2') \times$$
$$(j1 + j2' + o1') \times (j1 + j2' + o2') \times$$
$$(i1 + i2 + j1 + j2 + o1') \times (i1 + i2 + j1 + j2 + o2) \times$$
$$(i1' + i2' + j1 + j2 + o1) \times (i1' + i2' + j1 + j2 + o2) \times$$
$$(i1 + i2 + j1' + j2' + o1) \times (i1 + i2 + j1' + j2' + o2) \times$$
$$(i1' + i2' + j1' + j2' + o1) \times (i1' + i2' + j1' + j2' + o2) = 1$$

(formula 3)

In other words, the product of the items for each line of FIG. 9 expressed in the format of (formula 2) are the left side of (formula 3).

Figures 12, 13:
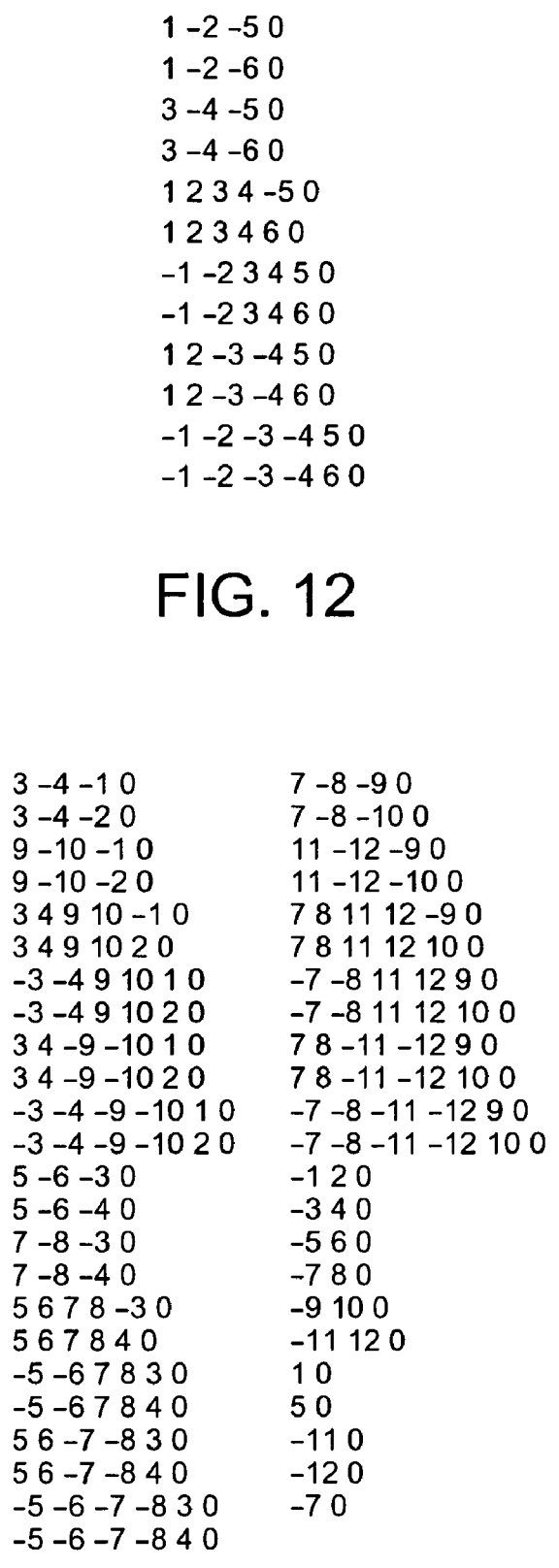

The following conversion is made to allow the data processor device (computer) 2 to convert it to any easy to use format. Namely, i1 is expressed as 1, i2 as 2, j1 as 3, j2 as 4, o1 as 5, and o2 as 6, and each negation (logic inversion) is shown by a minus. Also, the formula within the parentheses in (formula 3) is expressed by one line, the + (or) is omitted (not shown), and is a blank. These results are shown in FIG. 12. Namely, expressing (formula 3) in the format as shown in FIG. 12, allows input by the satisfiability decision unit 23. The 0 at the end of each line indicates the termination of that item. This format is generally also called CNF by those in this field but in this invention is called the conjunctive normal form. In this system, the conjunctive normal form for the combination of logic circuit elements used in the logic circuit is embedded internally beforehand.

Figure 15:
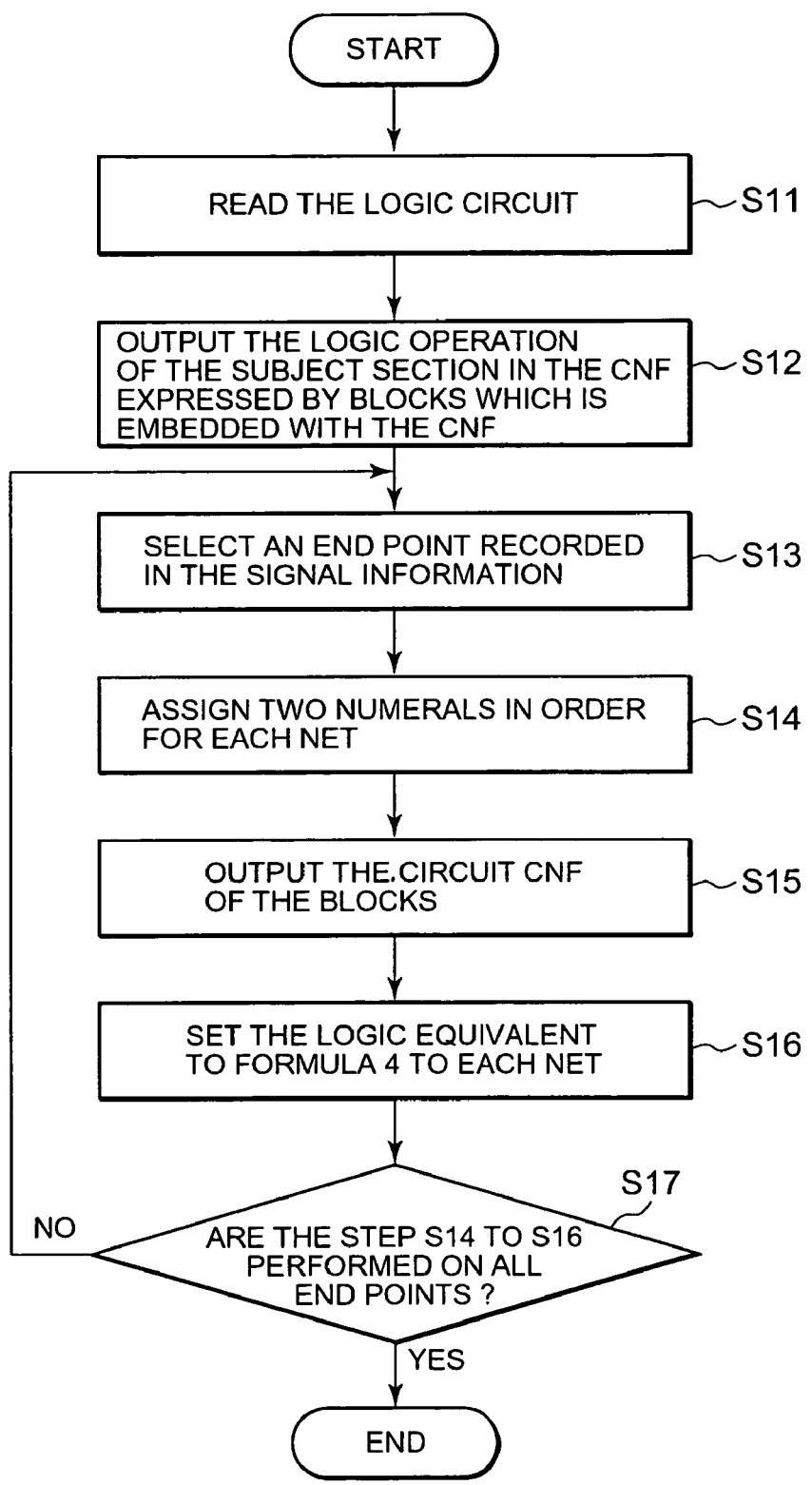
FIG. 15 is a flow chart showing example of operation performed in step S2 of FIG. 14.

The operation is described next referring to FIG. 15.

The logic extractor unit 21 includes the following steps.

Step 1: The logic circuit 31 is read (step S11). If the conjunctive normal form is not pre-embedded as to all blocks within the logic circuit then equivalent conversion is performed on blocks the conjunctive normal form of which is not embedded (step S12). It is generally known that all logic circuits can be equivalently converted with an inverter and a two-input NOR gate.

Step 2: End points recorded in the signal information 33 are selected in sequence, one each from the logic circuit 31. The following steps are performed on all end points (step S13).

Step 3: The input side is traced from the selected end points, and two numerals (n1, n2) are assigned in order starting from 1 for each net (step S14) (Tracing back from the end point, the first net is (1,2) and from thereon continues as (3, 4) (5, 6). The trace is made from the circuit input up to the flip-flop).

Step 4: The circuit is again traced from the end point to the input side, and the logic library 32 is referred to for each block, and a search made for logic of the same conjunctive normal form, the conjunctive normal form is substituted into numerals assigned to each connected net, and is output as the circuit CNF 34 (step S15).

Step 5: The combination (1, 0) cannot occur in each net, so the logic equivalent to n1'+n2 (formula 4) is added to the circuit CNF 34 (step S16).

It is judged if the steps S14 to S16 are performed on all end points (step S17). If No, the step S13 is performed.

The above steps are described while referring to FIG. 4 and FIG. 5.

Step 1: The logic circuit 31 is read. This was read as per FIG. 4 but in this example, there are only two-input NOR gates in the combination logic circuit blocks so the process proceeds to the next step.

Step 2: Read the signal information 33 (FIG. 5) and set A-reg as the end point.

Step 3: A trace is made toward the input from A_reg, and (1,2) is assigned to net N001, (3,4) to N003, (5,6) to multi_async, (7,8) to other, (9,10) to N002, and (11, 12) to strb. In this example, the trace was made in sequence from the input pins below the block; however, the trace may also be made from the upper pins.

Step 4: A trace is again made to the input side from A_reg. A check of the logic library UO1 is first of all made, and the circuit is two-input NOR gates so the embedded conjunctive normal form of the two-input NOR gate is extracted. This is expressed in FIG. 12. However, the numbers are made to match the node numbers. For example in the case of FIG. 12, the inputs are (1, 2) (3, 4) and the output is (5, 6), however the input for UO1 is (3, 4) of N003, and (9, 10) of N002, and the output is (1, 2) of N001 so the inputs and output are substituted into these node numbers, and output to the circuit CNF 34. Those results therefore correspond to line 1 through line 12 of FIG. 13.

The same processing is subsequently performed for all gates to generate up through line 36 in FIG. 13.

Step 5: Logic incorporating the formula 4 is then output to all nets The result for net N001 for example is −1, 2. That result corresponds to lines 37 through line 42 in In FIG. 13, the line 1 up to line 24 are written on the left side, while lines 25 and onward are written on the right side.

Figure 16:
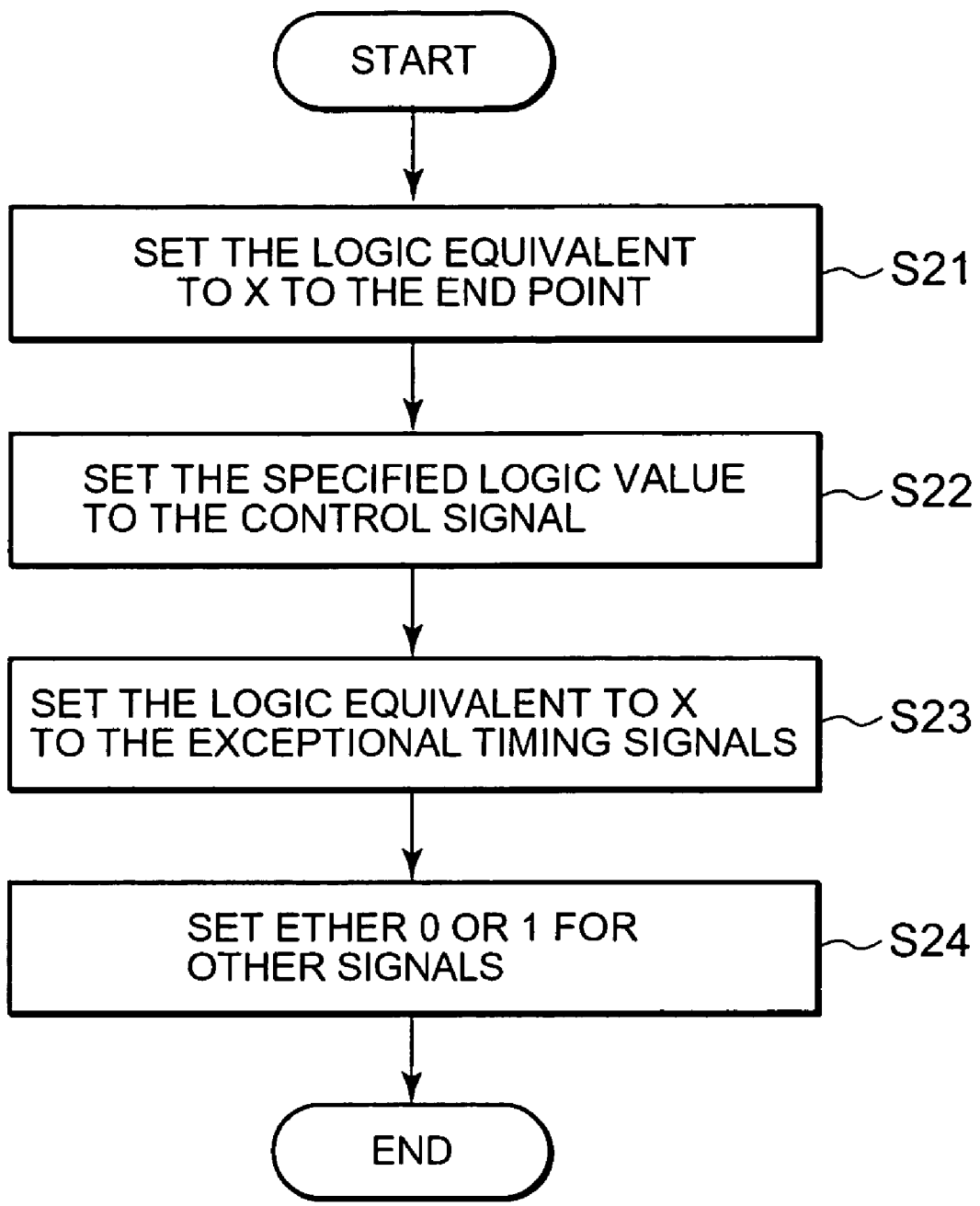
FIG. 16 is a flow chart showing example of operation performed in step S3 of FIG. 14.

The steps performed by the boundary condition setter unit 22 in S4 of FIG. 14 are described while referring to FIG. 16.

The boundary condition setter unit 22 reads the signal information 22, and outputs (1, 1) equivalent to X for the end point, adding the logic setting to the circuit CNF 34 (step S21 in FIG. 16). However, even specifying (1, ?) from formula 1 will yield an identical value to (1, 1) so (1, ?) may be output as a substitute for (1, 1).

The specified logic value is set to the control signal (start point) (step S22 in FIG. 16). In other words, if 0 is specified then the logic setting (0, 0) for the control signal is added to the circuit CNF 34, and if a 1 is specified then the logic setting (0, 1) at the control signal is added.

For start points of exceptional timing signals, (1, 1) equivalent to X, is set, and the logic setting showing that is added to the circuit CNF 34 (step S23 in FIG. 16). However, even if a (1,?) is specified per formula 1, this value is equivalent to (1, 1) so a (1, ?) is output instead of (1, 1).

For start points of other signals, either a 0 or a 1 can be used so a (0, ?) is set, and the logic setting showing that is added to the circuit CNF 34 (step S24 in FIG. 16). (Here, an ? signifies that nothing was specified.)

In the case of FIG. 5, a (1, ?) equivalent to X is specified for A_reg, however that net is already assigned to (1, 2) at N001 so a 1 is output (line 43 in FIG. 13).

The multi-async is an exceptional timing signal so a (1, ?) is applied. In that case, the multi-async net is assigned to (5, 6) so that a 5 is output (line 44 of FIG. 13).

For the control signal, a 0 is applied to the strb, so that (0, 0) is set. An (11, 12) are assigned to the strb net so that a −11 and −12 are output (line 45, 46 of FIG. 13).

The other of other signals is 0 or 1, and the net other is assigned to (7, 8) so that a −7 is output (line 47 of FIG. 13).

When the control signal is the applied logic value in the circuit CNF 34, and further under the condition that the exceptional timing signal start point is X, a satisfiability decision is made on whether the end point of the exceptional timing signal is X or not, after first considering all 0, 1 combinations of other input signals.

The satisfiability decision unit 23 reads the circuit CNF 34, and makes an all-inclusive search for a satisfaction solution. If there is a satisfaction solution, then that is decided, if not, then it is decided there is no satisfaction solution. In the current example, it is decided there is no satisfaction solution.

If there is no satisfaction solution, the result output unit 24 reports there is no hazard. However if there is a satisfaction solution, then it reports the potential hazard to the verification results 35.

The effect of the first embodiment of this invention is described next.

In the first embodiment of this invention, the satisfiability decision unit 23 makes an all-inclusive search of the circuit CNF 34 made by the logic extractor unit 21 and boundary condition setter unit 22 for a potential hazard occurrence to render the effect that a complete check can be made for conveyance of a hazard.

What is claimed is:

1. A computer-implemented circuit conjunctive normal form generating method, comprising the steps of:
    reading, by a data processing device, a logic circuit and an information of an end point for exceptional timing paths in said logic circuit;
    outputting, by the data processing device, logic operation of a section from a start point traced from said end point to said end point in a conjunctive normal form, based on processing of the logic circuit and the information read in the reading step;
    setting, by the data processing device, a logic equivalent to a hazard to said end point and a net where exceptional timing signal exists, based on the logic operation of the section output in the outputting step; and
    setting either a logic value 0 or a logic value 1 for all signals which do not correspond to the exception timing signal, based on the logic equivalent to the hazard set to said end point and said net set that are set in the setting step,
    wherein outputting said logic operation in said conjunctive normal form comprises:
        a) assigning two numerals (ni, nj) to each net in said section
        b) adding said circuit conjunctive normal form setting a logic equivalent to ni'+nj (the apostrophe (') indicates logic NOT) to each net for said end point;
        c) adding said circuit conjunctive normal form setting a logic equivalent to ni to each end point and each net where an exceptional timing signal is present; and
        d) performing steps a), b) and c) on all of said end points,
    wherein potential hazards of said logic circuit are obtained to determine potential faulty circuit operation of said logic circuit.

2. The circuit conjunctive normal form generating method according to claim 1, wherein outputting said logic operation in said conjunctive normal form further comprises:
    adding the circuit conjunctive normal form setting a logic equivalent to (ni', nj') to a circuit conjunctive normal form in a net where a signal with a logic value 0 was specified;
    adding the circuit conjunctive normal form setting a logic equivalent to (ni', nj), to a circuit conjunctive normal form in a net where a signal with a logic value 1 was specified;
    adding a logic equivalent to ni' to the circuit conjunctive normal form in a net where a signal is present whose logic value is unspecified.

3. The circuit conjunctive normal form generating method according to claim 1, wherein outputting said logic operation in said conjunctive normal form comprises:
    extracting blocks pre-embedded with a conjunctive normal form from said logic circuit; and
    outputting said logic operation of said blocks in said conjunctive normal form.

4. The circuit conjunctive normal form generating method according to claim 3, wherein, if not all of the blocks in said logic circuit were embedded with said conjunctive normal form, outputting said logic operation in said conjunctive normal form comprises performing equivalent conversion such that said section is expressed only by logic circuits of blocks pre-embedded with the conjunctive normal form.

5. The circuit conjunctive normal form generating method according to claim 1, wherein outputting said logic operation in said conjunctive normal form comprises:
    tracing to an input side from each end point to said start point;
    referring to a logic library for each block;
    searching for a same logic conjunctive normal form as in said logic library;
    substituting said conjunctive normal form into numerals assigned to a connected network; and
    outputting it as a circuit conjunctive normal form.

6. A computer-implemented hazard check method, comprising the steps of:
    reading, by a data processing device, a logic circuit and an information of an end point;
    outputting, by the data processing device, logic operation of a section from a start point traced from said end point to said end point in a conjunctive normal form, based on processing of the logic circuit and the information read in the reading step;
    setting, by the data processing device, a logic equivalent to the hazard to said end point and said net where exceptional timing signal exists, based on the logic operation of the section output in the outputting step;
    making, by the data processing device, a hazard check by deciding a satisfiability of said circuit conjunctive normal form, based on the logic equivalent to the hazard set to said end point and said net that are set in the setting step; and setting either a logic value 0 or a logic value 1 for all signals which do not correspond to the exception timing signal,
wherein outputting said logic operation in said conjunctive normal form comprises:
  a) assigning two numerals (ni, nj) to each net in said section;
  b) adding said circuit conjunctive normal form setting a logic equivalent to ni'+nj (the apostrophe (') indicates logic NOT) to each net for said end point;
  c) adding said circuit conjunctive normal form setting a logic equivalent to ni to each end point and each net where an exceptional timing signal is present; and
  d) performing steps a), b) and c) on all of said end points,
wherein potential hazards of said logic circuit are obtained to determine potential faulty circuit operation of said logic circuit.

7. A circuit conjunctive normal form generating device embodied as a computer, comprising:
a reading unit configured to read a logic circuit and an information of an end point;
and output unit configured to receive the logic circuit and the information of the end point read by the reading unit and to output logic operation of a section from a start point traced from said end point to said end point in a conjunctive normal form;
a setting unit configured to receive the logic operation of the section output by the output unit and to set a logic equivalent to a hazard to said end point and a net where exceptional timing signal exists,
wherein said output unit outputs said logic operation in said conjunctive normal form by assigning two numerals (ni, nj) to each net in said section, setting a logic equivalent to the hazard, adding the circuit conjunctive normal form setting the logic equivalent to ni'+ni (the apostrophe (') indicates logic NOT) to each net for said end point, and adding said circuit conjunctive normal form setting a logic equivalent to ni to each end point and each net where an exceptional timing signal is present, for each of said end points in said logic circuit,
wherein potential hazards of said logic circuit are obtained to determine potential faulty circuit operation of said logic circuit.

8. The circuit conjunctive normal form generating device according to claim 7, wherein means for setting a logic equivalent to a hazard adds the circuit conjunctive normal form setting a logic equivalent to (ni', nj') to a circuit conjunctive normal form in a net where a signal with a logic value 0 was specified, adds said circuit conjunctive normal form setting a logic equivalent to (ni', nj), to said circuit conjunctive normal form in a net where a signal with a logic value 1 was specified, and adds a logic equivalent to ni' to said circuit conjunctive normal form in a net where a signal is present whose logic value is unspecified.

9. The circuit conjunctive normal form generating device according to claim 7, wherein said means for outputting said logic operation in said conjunctive normal form extracts blocks pre-embedded with said conjunctive normal form from said logic circuit, and outputs said logic operation of said blocks in said conjunctive normal form.

10. The circuit conjunctive normal form generating device according to claim 9, wherein, if not all of the blocks in said logic circuit were embedded with said conjunctive normal form, said means for outputting said logic operation in said conjunctive normal form performs equivalent conversion such that said section is expressed only by logic circuits of blocks pre-embedded with said conjunctive normal form.

11. The circuit conjunctive normal form generating method according to claim 7, wherein said means for outputting logic operation in said conjunctive normal form traces to an input side from each end point, refers to a logic library for each block, searches for a same logic conjunctive normal form as in said logic library, substitutes said conjunctive normal form into numerals assigned to connected net, and outputs it as said circuit conjunctive normal form.

12. A hazard check device embodied as a computer, comprising:
a reading unit configured to read a logic circuit and an information of an end point;
and output unit configured to receive the logic circuit and the information of the end point read by the reading unit and to output logic operation of a section from a start point traced from said end point to said end point in a conjunctive normal form;
a setting unit configured to receive the logic operation of the section output by the output unit and to set a logic equivalent to a hazard to said end point and a net where exceptional timing signal exists; and
a hazard check making unit configured to make a hazard check by deciding a satisfiability of said circuit conjunctive normal form,
wherein said output unit outputs said logic operation in said conjunctive normal form by assigning two numerals (ni, nj) to each net in said section, setting a logic equivalent to the hazard, adding the circuit conjunctive normal form setting the logic equivalent to ni'+nj (the apostrophe (') indicates logic NOT) to each net for said end point, and adding said circuit conjunctive normal form setting a logic equivalent to ni to each end point and each net where an exceptional timing signal is present, for each of said end points in said logic circuit,
wherein potential hazards of said logic circuit are obtained to determine potential faulty circuit operation of said logic circuit.

* * * * *